United States Patent [19]

Jerram et al.

[11] Patent Number: 5,017,891

[45] Date of Patent: May 21, 1991

[54] MAGNETRONS WITH RESONATOR ELEMENT FOR STABILIZING OUTPUT RADIATION FREQUENCY

[75] Inventors: Paul A. Jerram, Wethersfield; Stephen Bainbridge, Braintree, both of United Kingdom

[73] Assignee: EEV Limited, Essex, United Kingdom

[21] Appl. No.: 433,701

[22] Filed: Nov. 13, 1989

[51] Int. Cl.[5] .......................... H03B 9/10; H01J 23/54

[52] U.S. Cl. .................................... 331/88; 315/39.53; 315/39.61; 331/90; 333/209

[58] Field of Search ........................ 331/88, 90, 91, 96; 315/39.53, 39.55, 39.61, 39.77; 333/208, 209, 211, 212; 330/47, 56

[56] References Cited

U.S. PATENT DOCUMENTS

| | | | |
|---|---|---|---|
| 2,630,533 | 3/1953 | Herlin | 331/88 |
| 2,787,711 | 4/1957 | Glass | 315/39.53 X |
| 2,924,792 | 2/1960 | Gyorgy | 333/208 X |
| 4,267,537 | 5/1981 | Karmel | 333/231 |
| 4,500,859 | 2/1985 | Ren et al. | 333/208 |
| 4,724,403 | 2/1988 | Takayama | 331/96 |

FOREIGN PATENT DOCUMENTS

| | | |
|---|---|---|
| 1081714 | 8/1967 | United Kingdom . |
| 1232159 | 5/1971 | United Kingdom . |
| 1376938 | 12/1974 | United Kingdom . |
| 1512186 | 5/1978 | United Kingdom . |
| 1552974 | 9/1979 | United Kingdom . |
| 2145575 | 3/1985 | United Kingdom . |
| 2153598 | 8/1985 | United Kingdom . |

*Primary Examiner*—Siegfried H. Grimm
*Attorney, Agent, or Firm*—Spencer & Frank

[57] ABSTRACT

The performance of a magnetron may be degraded by its output frequency changing. This degradation may be reduced by fixing a resonator element in the magnetron's output waveguide enabling temperature stabilization to be achieved and also permitting the output spectrum of the radiation to be narrowed.

8 Claims, 2 Drawing Sheets

MAGNETRONS WITH RESONATOR ELEMENT FOR STABILIZING OUTPUT RADIATION FREQUENCY

BACKGROUND OF THE INVENTION

This invention relates to magnetrons and more particularly to frequency stabilisation of output radiation from magnetrons.

The frequency of output radiation produced by a magnetron is determined primarily by the volume and configuration of its resonant cavities. Other factors may affect the output frequency and, in particular, changes in temperature will cause this frequency to drift undesirably. In the past, this drift has been compensated for by including additional cavities of low temperature coefficient coupled to the main resonant cavities so as to tune the magnetron to the desired frequency. Such arrangements are difficult to fabricate, bulky and expensive.

The present invention seeks to provide a relatively simple apparatus which permits effective stabilisation of the output frequency of a magnetron.

BRIEF SUMMARY OF THE INVENTION

According to the invention there is provided a magnetron comprising: an output waveguide along which output radiation generated by the magnetron is arranged to be transmitted and a resonator element positioned in the wave guide and arranged such that the output radiation is transmitted through it. By employing the invention, the frequency of output radiation may be stabilised by arranging the resonator element with a resonant frequency which matches the desired operating frequency of athe magnetron.

A further advantage of using the invention is that the output spectrum of the magnetron may be narrowed to give a more desirably frequency distribution. This is illustrated in FIGS. 1*a* and 1*b* which respectively show the frequency spectrum of radiation from a magnetron without a resonator element, and the frequency spectrum of radiation from a magnetron with a resonator element included in its output waveguide.

More than one resonator element may be positioned in the output waveguide such that the ouput radiation is transmitted through them. This enables the frequency spectrum to be further constricted if desired.

The output waveguide may be immediately adjacent a magnetron resonant cavity and integral with the magnetron, such that it directly receives the output radiation, or it may form another part of the transmission path and be more remote from the magnetron.

Preferably, the resonator element consists of dielectric material and it is preferred that it is a solid cylinder in configuration, although other shapes may be used.

Since the resonator element is placed in the output waveguide, the physical size of the magnetron compared to that of the conventional magnetron need not necessarily be increased.

BRIEF DESCRIPTION OF THE DRAWINGS

One way in which the invention may be performed is now described by way of example only with reference to the accompanying drawings, in which.

DESCRIPTION OF PREFERRED EMBODIMENT

Figure 1A:
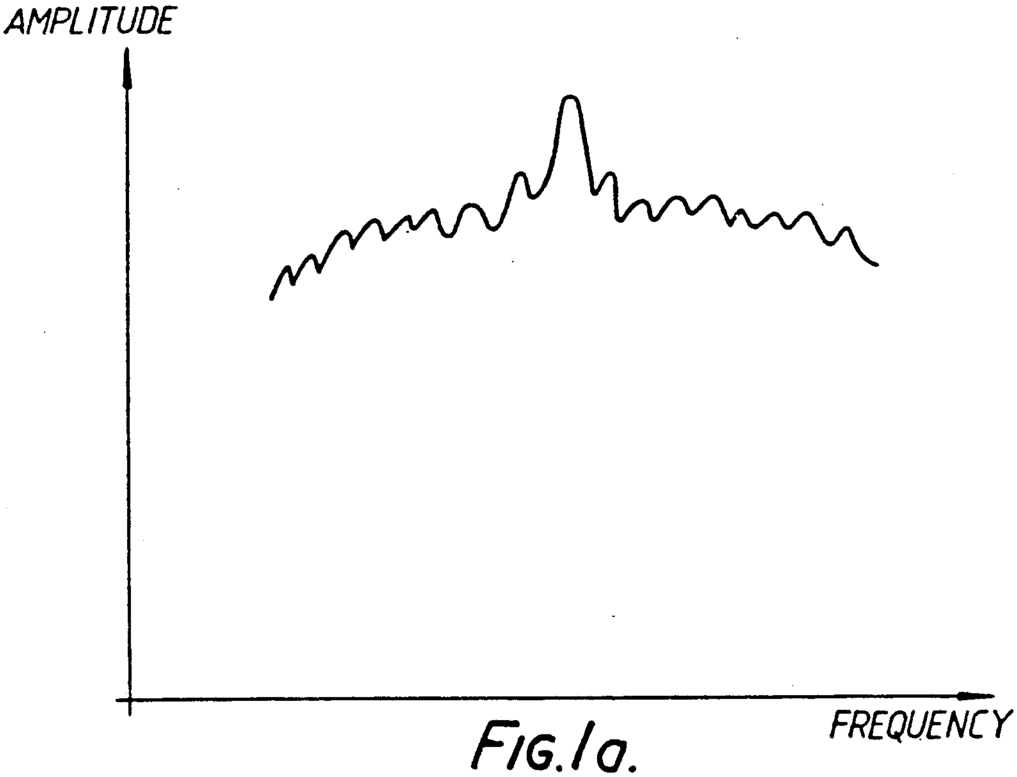
FIG. 1*a* is a graph illustrating a frequency spectrum of radiation from a magnetron without a resonator element.
Figure 1B:
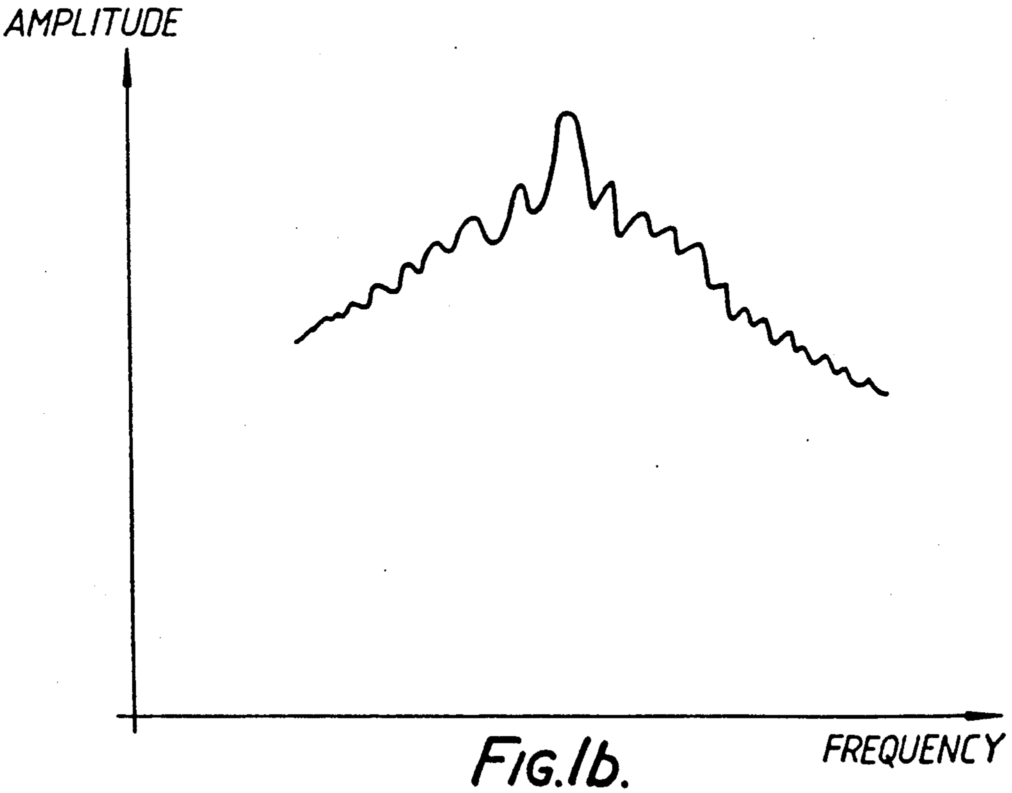
FIG. 1*b* illustrates a frequency spectrum of radiation from a magnetron with a resonator element according to the present invention.
Figure 2:
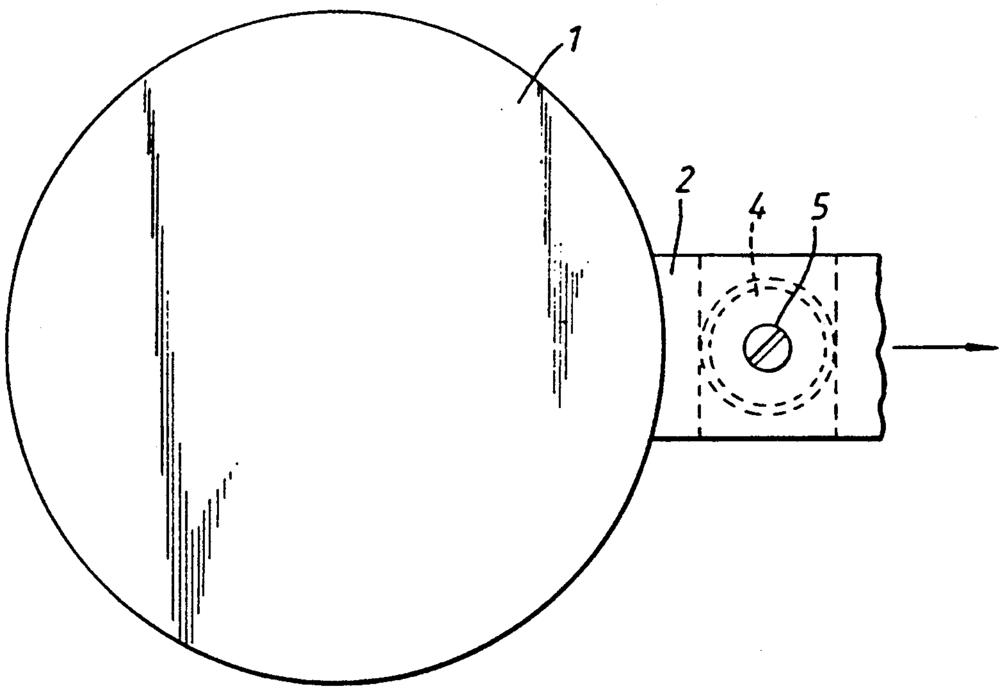
FIG. 2 is a schematic plan view of a magnetron in accordance with the invention.
Figure 3:
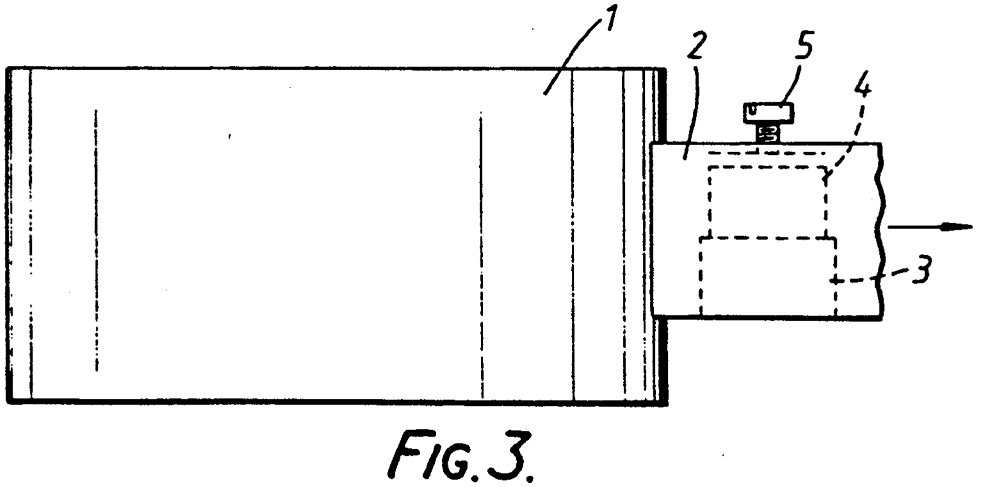
FIG. 3 is a schematic side view of the magnetron shown in FIG. 2.

With reference to FIGS. 2 and 3, a magnetron includes a plurality of resonant cavities, an anode, a cathode, and means for producing a magnetic field, and is indicated generally at 1. During operation, radiation generated by the magnetron is transmitted along an output waveguide 2 in the direction shown by the arrow.

The waveguide 2 is rectangular nad includes a stepped portion 3 which defines a trnasverse section of reduced area.

A dielectric resonator element 4, in the form of a solid cylinder, is struck on the stepped portion 3. The stepped portion 3 ensures that radiation from the magnetron 1 is channelled through the resonator element 4. The resonator element 4 has a resonant frequency which is matched to the desired frequency of the output radiation from the magnetron and propagates frequencies closest to its resonant frequency with greatest efficiency and those furthest away from the resonant frequency with least efficiency.

Fine tuning of the resonator element 4 is achieved by use of a tuning screw 5.

We claim:

1. A magnetron comprising:
   an output waveguide along which output radiation generated by said magnetron is arranged to be transmitted, said output waveguide having a portion of reduced transverse sectional area; and
   a resonator element positioned in said portion of said waveguide and arranged so that the output radiation is transmitted through said resonator element.

2. A magnetron as claimed in claim 1, wherein said resonator element has a resonant frequency matched to a desired output frequency of said magnetron.

3. A magnetron as claimed in claim 1, wherein said resonator element is of dielectric material.

4. A magnetron as claimed in claim 1, wherein said resonator element is a solid cylinder.

5. A magnetro nas claimed in claim 1, wherein said resonator element has a resonant frequency and said magnetron further includes means for adjusting the resonant frequency of said resonator element.

6. A magnetron as claimed in claim 1, wherein said portion is a stepped portion which ensures that the output radiation is channelled through said resonator element.

7. A magnetron as claimed in claim 5, wherein said adjusting means is a tuning screw which fine tunes the resonant frequency of said resonator element.

8. A magnetron comprising:
   an output waveguide along which output radiation generated by said magnetron is arrnaged to be transmitted, said output waveguide having a portion of reduced transverse sectional area;
   a resonator element postioned in the reduced transverse sectional area of said waveguide and arranged so that the output radiation is transmitted through said resonator element at a resonant frequency; and
   means, in communication with said resonator element, for adjusting the resonant frequency of said resonator element wherein said resonator element stbilizes the frequency of the output radiation generated by said magnetron.

* * * * *